(12) United States Patent
Kim

(10) Patent No.: US 8,575,833 B2
(45) Date of Patent: Nov. 5, 2013

(54) ORGANIC LIGHT-EMITTING DISPLAY APPARATUS INCLUDING IMPROVED POWER SUPPLY LINES

(75) Inventor: Yun-Tae Kim, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 0 days.

(21) Appl. No.: 13/333,769

(22) Filed: Dec. 21, 2011

(65) Prior Publication Data
US 2012/0161613 A1 Jun. 28, 2012

(30) Foreign Application Priority Data
Dec. 28, 2010 (KR) .................. 10-2010-0137217

(51) Int. Cl.
*H01J 1/62* (2006.01)
*H01J 63/04* (2006.01)
(52) U.S. Cl.
USPC ........... 313/504; 313/483; 313/500; 313/501; 313/502; 313/503; 313/506; 313/505

(58) Field of Classification Search
None
See application file for complete search history.

(56) References Cited

U.S. PATENT DOCUMENTS

| 6,690,110 B1 | 2/2004 | Yamada et al. | |
| 7,397,179 B2 * | 7/2008 | Kim ............................ | 313/506 |
| 2005/0029937 A1 | 2/2005 | Kim | |
| 2007/0120460 A1 * | 5/2007 | Youn et al. ..................... | 313/495 |

FOREIGN PATENT DOCUMENTS

| KR | 10-2001-0067268 A | 7/2001 |
| KR | 10-2005-0017695 A | 2/2005 |

* cited by examiner

*Primary Examiner* — Natalie Walford
(74) *Attorney, Agent, or Firm* — Knobbe Martens Olson & Bear LLP

(57) ABSTRACT

An organic light-emitting display apparatus including improved power supply lines which may sufficiently handle high current. The organic light-emitting display apparatus includes power supply lines outside an encapsulation layer sealing the display unit to a substrate. Because the power supply lines are outside the encapsulation layer their thickness can be increased to increase the current conducting capacity of the power supply lines.

12 Claims, 4 Drawing Sheets

ORGANIC LIGHT-EMITTING DISPLAY APPARATUS INCLUDING IMPROVED POWER SUPPLY LINES

CROSS-REFERENCE TO RELATED APPLICATIONS

This application claims the benefit of Korean Patent Application No. 10-2010-0137217, filed on Dec. 28, 2010, in the Korean Intellectual Property Office, the disclosure of which is incorporated herein in its entirety by reference.

BACKGROUND

1. Field

The disclosed technology relates to an organic light-emitting display apparatus, and more particularly, to an organic light-emitting display apparatus including improved power supply lines which effectively handle high current.

2. Description of the Related Technology

In general, an organic light-emitting display apparatus includes a light-emitting layer formed of an organic material which is disposed between an anode and a cathode. When voltages are applied to the anode and the cathode, holes injected from the anode and electrons injected from the cathode recombine in the light-emitting layer to generate excitons. When the excitons drop from an excited state to a ground state, light is emitted and an image is created.

Power supply lines for applying voltages to the anode and the cathode are installed in the organic light-emitting display apparatus. However, as sizes of display apparatuses have recently increased, current flowing through the power supply lines has increased. Accordingly, there are demands for developing power supply lines which effectively handle high current.

SUMMARY OF CERTAIN INVENTIVE ASPECTS

One inventive aspect is an organic light-emitting display apparatus including a substrate having an input terminal unit on a surface thereof and a display unit on the substrate and including a light-emitting layer and first and second electrodes facing one another with the light-emitting layer therebetween. The display apparatus also includes an encapsulation member attached to the substrate and sealing the display unit in a gap formed between the encapsulation member and the substrate, a first pad connected to the first electrode and extending beyond the encapsulation member of the substrate, and a second pad connected to the second electrode and extending beyond the encapsulation member of the substrate. The display apparatus also includes a first power supply line connecting the input terminal unit and the first pad outside the encapsulation member of the substrate, and a second power supply line connecting the input terminal unit and the second pad outside the encapsulation member of the substrate.

BRIEF DESCRIPTION OF THE DRAWINGS

The above and other features and advantages of the present invention are apparent from the description of certain exemplary embodiments with reference to the attached drawings in which.

DETAILED DESCRIPTION OF CERTAIN INVENTIVE EMBODIMENTS

Figure 1:
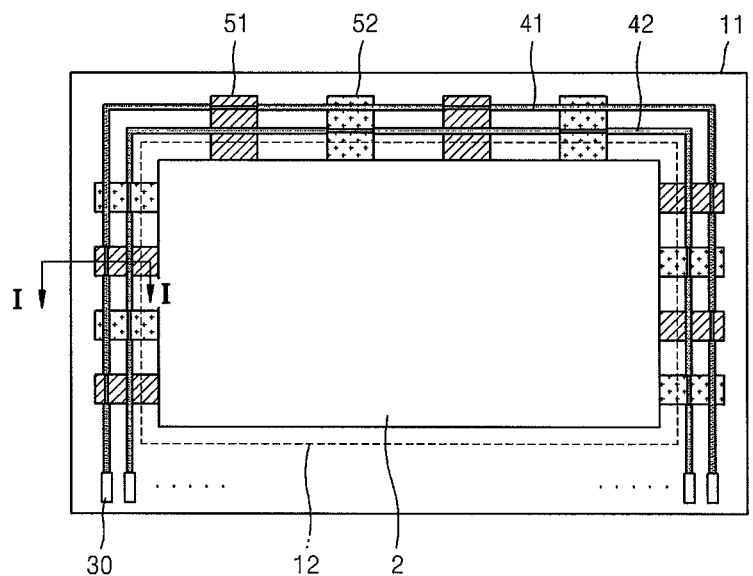
FIG. 1 is a plan view illustrating an organic light-emitting display apparatus according to an embodiment.

Certain embodiments are described more fully with reference to the accompanying drawings, in which exemplary embodiments are shown.

In the drawings, the same reference numerals generally denote the same elements. In the following description certain concepts may be omitted in order not to make the discussed subject matter unclear.

In the drawings, thicknesses of some layers or regions are exaggerated for clarity. It will also be understood that when a layer is referred to as being "on" another layer or a substrate, it can be directly on the other layer or the substrate, or intervening layers may also be present therebetween.

Figure 2:
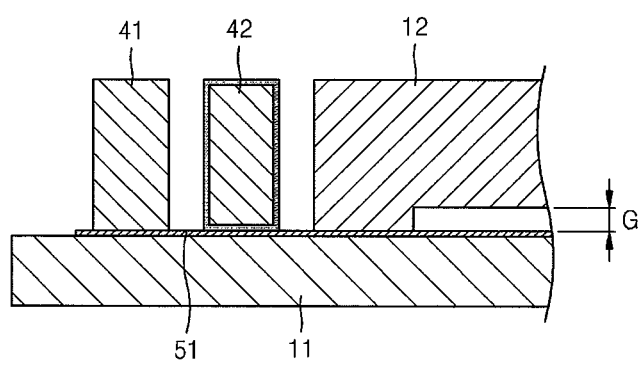
FIG. 2 is a cross-sectional view taken along line I-I of FIG. 1.
Figure 3:
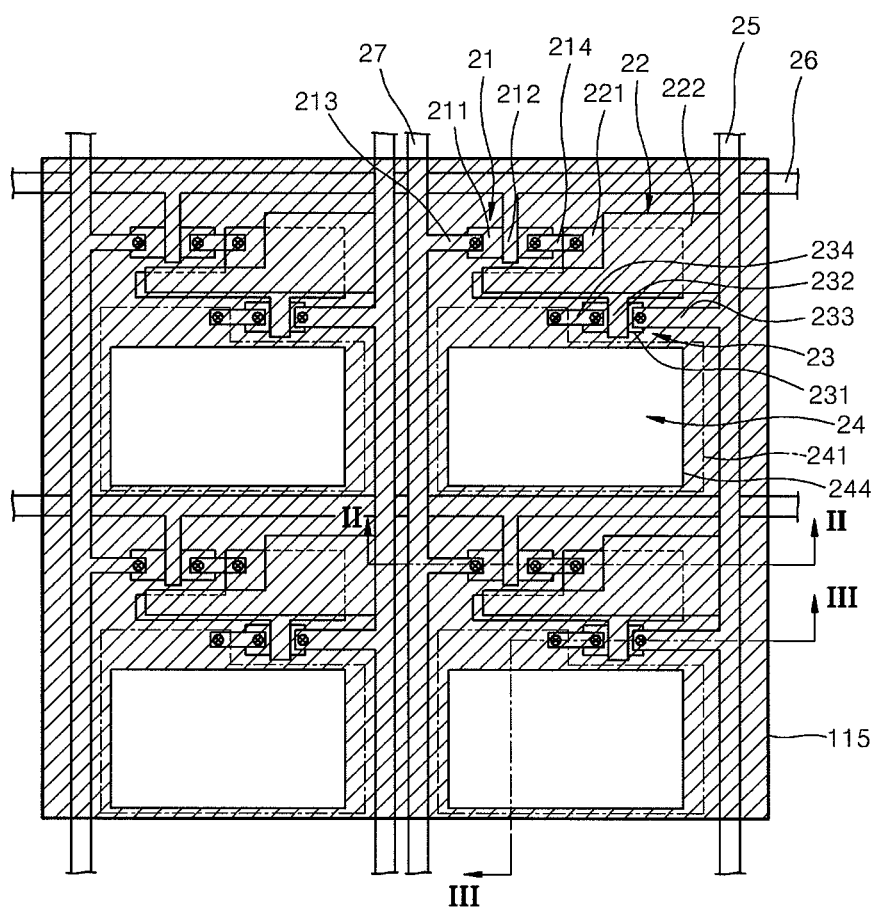
FIG. 3 is an enlarged, partial plan view illustrating some pixels of a display unit.
Figure 4:
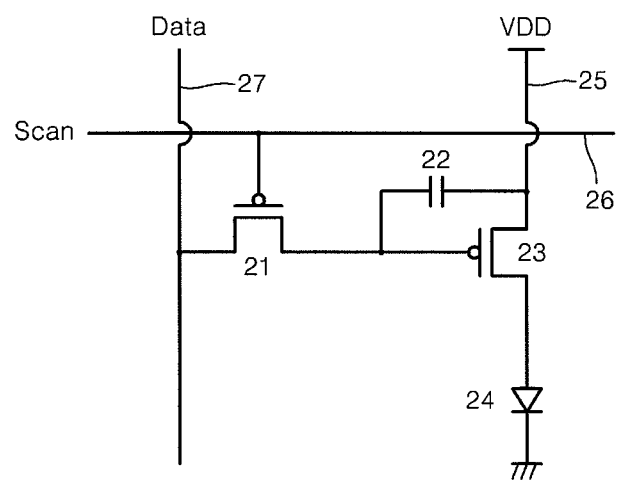
FIG. 4 is a circuit diagram illustrating an equivalent circuit of one pixel.

FIG. 1 is a plan view illustrating an organic light-emitting display apparatus according to an embodiment. FIG. 2 is a cross-sectional view taken along line I-I of FIG. 1. FIG. 3 is an enlarged, partial plan view illustrating some pixels of a display unit 2. FIG. 4 is a circuit diagram illustrating an equivalent circuit of one pixel.

Referring to FIG. 1, the organic light-emitting display apparatus includes the display unit 2 which is formed on a substrate 11 and on which an image is displayed, and an encapsulation member 12 which covers the display unit 2. Accordingly, the display unit 2 is sealed in a gap G (see FIG. 2) between the substrate 11 and the encapsulation member 12.

Another inventive aspect is a first pad 51 and a second pad 52 respectively connected to an anode 241 (see FIG. 6, referred to as a first electrode hereinafter) and a cathode 243 (see FIG. 6, referred to as a second electrode hereinafter) disposed in each pixel are disposed on the substrate 11. Another inventive aspect is a first power supply line 41 and a second power supply line 42 connect the first and second pads 51 and 52 to an input terminal unit 30 for inputting power. The first power supply line 41 and the second power supply line 42 are outside the encapsulation member 12 on the substrate 11 as shown in FIGS. 1 and 2. Accordingly, since space constraint is less than that in a case where the first power supply line 41 and the second power supply line 42 are formed in the gap G between the substrate 11 and the encapsulation member 12, thicknesses of the first power supply line 41 and the second power supply line 42 may be freely increased, which will be explained further below.

FIG. 3 is an enlarged view illustrating the display unit 2. Another inventive aspect is a plurality of pixels are arranged in the display unit 2. FIG. 4 is a circuit diagram illustrating an equivalent circuit of each of the pixels.

As shown in FIGS. 3 and 4, each of the pixels includes at least two thin film transistors (TFTs) including a first TFT 21 that is a switching element and a second TFT 23 that is a driving element, one capacitor 22, and one organic EL element 24. The numbers of the TFTs and the capacitor 22 are not limited thereto, and more TFTs and more capacitors may be used.

The first TFT 21 is driven by a scan signal applied to a gate line 26 and transmits a data signal applied to a data line 27. The second TFT 23 supplies current to the EL element 24 according to the data signal transmitted through the first TFT 21, that is, according to a voltage difference Vgs between a gate and a source of the second TFT 23. The capacitor 22 stores the data signal, which is transmitted through the first TFT 21, for one frame.

Figure 5:
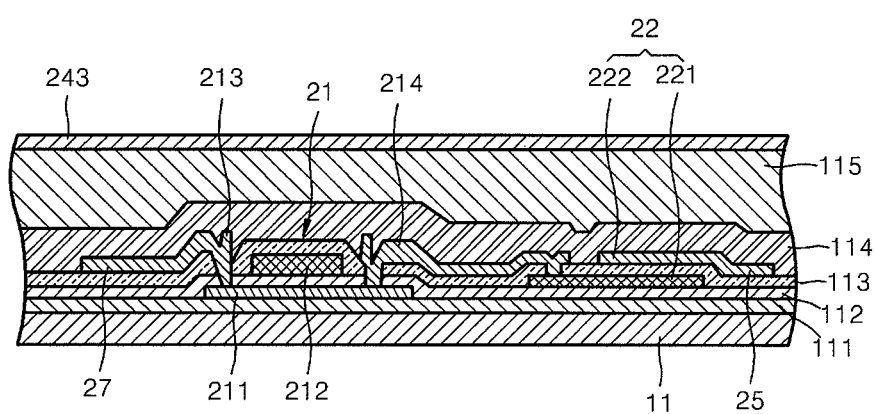
FIG. 5 is a cross-sectional view taken along line of FIG. 3.
Figure 6:
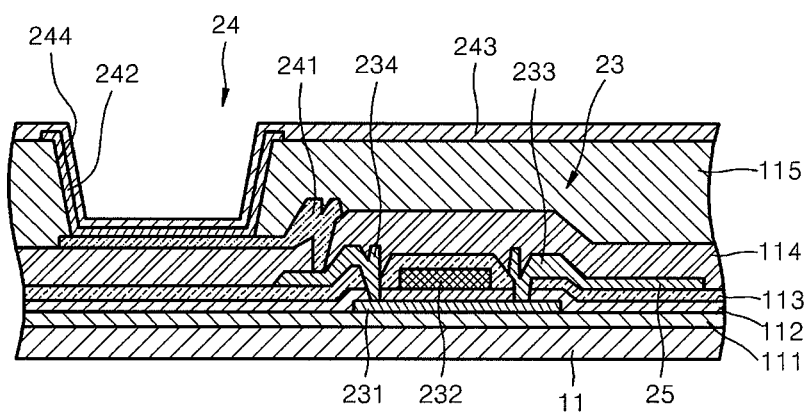
FIG. 6 is a cross-sectional view taken long line of FIG. 3.

The organic light-emitting display apparatus is formed as shown in FIGS. 3, 5, and 6. As shown in FIGS. 3, 5, and 6, a buffer layer 111 formed of $SiO_2$ or the like is formed on the substrate 11 formed of a glass material, and the first TFT 21, the second TFT 23, the capacitor 22, and the EL element 24 are disposed on the buffer layer 111.

As shown in FIGS. 3 and 5, the first TFT 21 includes a first active layer 211 formed on the buffer layer 111, a gate insulating film 112 formed on the first active layer 211, and a gate electrode 212 formed on the gate insulating film 112. The first active layer 211 may be formed of an amorphous silicon thin film or a polycrystalline silicon thin film. The semiconductor active layer has a source region and a drain region heavily doped with N or P-type impurities. The gate insulating film 112 formed of $SiO_2$ or the like is disposed on the first active layer 211, and the gate electrode 212 formed of a conductive material such as MoW or Al/Cu is formed at a predetermined area on the gate insulating film 112. The gate electrode 212 is connected to the gate line 26 for applying a TFT on/off signal.

An interlayer insulating film 113 is formed on the gate electrode 212, and a source electrode 213 and a drain electrode 214 are respectively formed to contact the source region and the drain region of the first active layer 211 through contact holes in the interlayer insulating film 113. The source electrode 213 is connected to the data line 27 of FIG. 4 to apply a data signal to the first active layer 211, and the drain electrode 214 is connected to a first charge electrode 221 of the capacitor 22.

Another inventive aspect is a passivation film 114 formed of $SiO_2$ or SiNx is formed on the source and drain electrodes 213 and 214, and a planarization film 115 formed of acryl, polyimide, or benzocyclobutene (BCB) is formed on the passivation film 114.

As shown in FIGS. 3 and 5, the capacitor 22 is disposed between the first TFT 21 and the second TFT 23 and stores a driving voltage necessary for driving the second TFT 23 for one frame. The capacitor 22 includes the first charge electrode 221 connected to the drain electrode 214 of the first TFT 21, a second charge electrode 222 formed over the first charge electrode 221 to partially overlap the first charge electrode 221 and electrically connected to a driving power line 25 for applying driving power, and the interlayer insulating film 113 formed between the first charge electrode 221 and the second charge electrode 222 is used as a dielectric body. The structure of the capacitor 22 is not limited thereto. For example, a silicon thin film of a TFT and a conductive layer of a gate electrode may be respectively used as a first charge electrode and a second charge electrode and a gate insulating layer may be used as a dielectric layer.

As shown in FIGS. 3 and 6, the second TFT 23 includes a second active layer 231 on the buffer layer 111 formed of an amorphous silicon thin film or a polycrystalline silicon thin film. The semiconductor active layer has source and drain regions heavily doped with N or P-type impurities. Another inventive aspect is a gate electrode 232 is formed on the second active layer 231 connected to the first charge electrode 221 of the capacitor 22 with the gate insulating film 112 therebetween and receives a TFT on/off signal. Another inventive aspect is a source electrode 233 for applying a reference voltage to the second active layer 231 is connected to the driving power line 25 and a drain electrode 234 for applying a driving voltage to the EL element 24 from the second TFT 23 are formed on the gate electrode 232. The interlayer insulating film 113 is disposed between the gate electrode 232 and the source and drain electrodes 233 and 234, and the passivation film 114 is interposed between the source and drain electrodes 233 and 234 and the first electrode 241. The first electrode 241 is an anode of the EL element 24.

The planarization film 115 formed of acryl or the like is formed on the first electrode 241, and after a predetermined opening 244 is formed in the planarization film 115, the EL element 24 is formed. The EL element 24, which emits red, green, and blue light according to a flow of current to display image information, includes the first electrode 241, which is connected to the drain electrode 234 of the second TFT 23 to receive plus power from the drain electrode 234, the second electrode 243, which is disposed to cover the entire pixel to supply minus power, and a light-emitting layer 242, which his disposed between the first and second electrodes 241 and 243 to emit light.

The first electrode 241, which is an anode, may be transparent formed of indium tin oxide (ITO) or the like, and the second electrode 243, which is a cathode, is formed by depositing Al/Ca or the like on a front surface if the organic light-emitting display apparatus. This device is a bottom emission display in which light is emitted toward the substrate 11. If the organic light emitting display apparatus is a top emission type in which light is emitted toward the encapsulation member 12 way from the substrate 11, the second electrode 243 may be formed of a transparent material, for example, by forming a semitransparent thin film formed of a metal such as Mg-Ag and depositing transparent ITO on the semitransparent thin film.

The light-emitting layer 242 may be a low molecular weight organic film or a high molecular weight organic film. If the light-emitting layer 242 is a low molecular weight organic film, the light-emitting layer 242 may be formed by stacking all or some of a hole injection layer (HIL), a hole transport layer (HTL), an organic emission layer (EML), an electron transport layer (ETL), and an electron injection layer (EIL). The low molecular weight organic film may be formed of any of various organic or non-organic materials such as copper phthalocyanine (CuPc), N,N'-Di(naphthalene-1-yl)-N,N'-diphenyl-benzidine (NPB), and tris-8-hydroxyquinoline aluminum (Alq3). Certain low molecular weight organic films may be formed by using vacuum deposition.

If the light-emitting layer 242 is formed of a high molecular weight organic film, the light-emitting layer 242 may include an HTL and an organic EML. The HTL may be formed of poly(3,4-ethylenedioxythiophene) (PEDOT), and the organic EML may be formed of a high molecular weight organic material such as poly-phenylenevinylene (PPV) or polyfluorene. The high molecular weight organic films may be formed by using screen printing or inkjet printing.

The display unit 2 illustrated in FIG. 1 includes the pixels, and an image is displayed on the display unit 2. That is, TFTs, capacitors, and EL elements as shown in FIGS. 3, 5, and 6 are installed in the display unit 2.

The encapsulation member 12 is attached to the substrate 11 on which the display unit 2 is formed, so that the display unit 2 is protected from, for example, external impact, moisture, or air. The encapsulation member 12 may be an insulating substrate formed of a glass material, or may be a carbon plate or a metal cap formed of a metal material. However, the encapsulation member 12 may be any type if the encapsulation member 12 is capable of protecting the display unit 2 from, for example, external impact. The encapsulation member 12 may be attached to the substrate 11 by a sealant (not shown) such as an ultraviolet-curable agent.

The input terminal unit 30 in which terminals are installed is located on a side surface of the substrate 11 on which the display unit 2 is formed. The input terminal unit 30 includes terminals to be connected to the data line 27, the gate line 26, the driving power line 25 connected to the first electrode 241, and the second electrode 243. Only terminals for connecting the first electrode 241, the second electrode 243, and a power source are illustrated, and others are not shown.

Meanwhile, the first pad 51 and the second pad 52 connected to the display unit 2 are formed on the substrate 11 outside the encapsulation member 12. The first pad 51 is connected to the driving power line 25 connected to the first electrode 241, and the second pad 52 is connected to the second electrode 243. Accordingly, a voltage is applied to the first electrode 241 via the driving power line 25 through the first pad 51, and a voltage is applied to the second electrode 243 through the second pad 52. Each of the first pad 51 and the second pad 52 may be formed of a metal material with a low resistance such as copper or silver.

The first and second power supply lines 41 and 42 for connecting the input terminal unit 30 and the first and second pads 51 and 52 are on the substrate 11. The first and second power supply lines 41 and 42 may be formed of a metal material with a low resistance such as copper or silver, and may have any of various cross-sectional shapes, for example, a circular shape or a rectangular shape.

The first and second power supply lines 41 and 42 are disposed to run along three side surfaces of the substrate 11 on which the input terminal unit 30 is formed. That is, the first and second power supply lines 41 and 42 surround outer edge portions of the substrate 11 outside the encapsulation member 12, such that the first power supply line 41 is located at an outer side and the second power supply line 42 is located at an inner side. Of course, the first power supply line 41 may be located at an inner side and the second power supply line 42 may be located at an outer side.

The first and second power supply lines 41 and 42 contact the first and second pads 51 and 52 and are electrically connected to the first and second pads 51 and 52. As shown in FIG. 1, portions of the first power supply line 41 outside the portion of the first power supply line 41 contacting the first pad 51 are surrounded by an insulating material, and portions of the second power supply line 42 outside the portion of the second power supply line 42 contacting the second pad are surrounded by an insulting material. Accordingly, although the first and second power supply lines 41 and 42 cross the first and second pads 51 and 52, the first power supply line 41 is electrically connected to only the first pad 51 of the first and second pads 51 and 52, and the second power supply line 42 is electrically connected to only the second pad 52 of the first and second pads 51 and 52. That is, when current flows to the first power supply line 41 through the input terminal unit 30, the current does not flow through the second pad 52, but flows to the first electrode 541 through the first pad 51. Similarly, if current flows to the second power supply line 42, the current does not flow through the first pad 51, but flows to the second electrode 243 through the second pad 52.

As shown in FIG. 2, since the first and second power supply lines 41 and 42 are not in the gap G between the encapsulation member 12 and the substrate 11 but are outside the encapsulation member 12, there is little space constraint. That is, if the first and second power supply lines 41 and 42 were formed in the gap G, thicknesses of the first and second power supply lines 41 and 42 is limited by the space constraint, and thus the first and second power supply lines 41 and 42 would fail to effectively handle high current. However, if the first and second power supply lines 41 and 42 are formed outside the encapsulation member 12 as shown in FIG. 1, thicknesses of the first and second power supply lines 41 and 42 may be large so that the thicknesses of the first and second power supply lines 41 and 42 are similar to a thickness of the encapsulation member 12, because there is little space constraint. The ability to effectively handle current is increased as the thicknesses of the first and second power supply lines 41 and 42 are increased. Accordingly, the organic light-emitting display apparatus may handle high current as sizes of display apparatuses has increased in recent years and the amount of current flowing through power supply lines has increased.

Hence, even though high current of, for example, 2 to 30 Another inventive aspect is a is applied through the input terminal unit 30, the current effectively flows through the first and second power supply lines 41 and 42 with a resistive (or IR) drop which is low enough to not cause poor display characteristics. As a result, a voltage is stably applied to the first electrode 241 and the second electrode 243 of the display unit 2, thereby improving the reliability of the organic light-emitting display apparatus.

While various aspects and features have been particularly shown and described with reference to certain exemplary embodiments, it will be understood by those of ordinary skill in the art that various changes in form and details may be made without departing from the spirit and scope of the present invention.

What is claimed is:

1. An organic light-emitting display apparatus comprising:
   a substrate;
   a display unit on the substrate and comprising:
      a light-emitting layer, and
      first and second electrodes, wherein the light-emitting layer is configured to emit light according to voltages on the first and second electrodes;
   an encapsulation member attached to the substrate and sealing the display unit in a gap formed between the encapsulation member and the substrate;
   an input terminal unit on the substrate outside the perimeter of the encapsulation member;
   a first pad selectively connected to the first electrode, wherein the first pad includes an uncovered portion which is outside the perimeter of the encapsulation member;
   a second pad connected to the second electrode, wherein the second pad includes an uncovered portion which is outside the perimeter of the encapsulation member;
   a first power supply line electrically connecting the input terminal unit to the uncovered portion of the first pad, wherein the first power supply line is completely outside the perimeter of the encapsulation member; and
   a second power supply line electrically connecting the input terminal unit to the uncovered portion of the second pad, wherein the second power supply line is completely outside the perimeter of the encapsulation member.

2. The organic light-emitting display apparatus of claim 1, wherein a thickness of each of the first power supplies line and the second power supply line is greater than the gap between the substrate and the encapsulation member.

3. The organic light-emitting display apparatus of claim 1, wherein the first power supply line and the second power supply line are formed along outer edge portions of the substrate outside the encapsulation member.

4. The organic light-emitting display apparatus of claim 3, wherein the first power supply line and the second power supply line are formed along outer edge portions of the substrate other than the outer edge portion of the substrate on which the input terminal unit is formed.

5. The organic light-emitting display apparatus of claim 4, wherein any one of the first power supply line and the second power supply line is formed at an inner side adjacent to the encapsulation member, and the other one is formed at an outer side.

6. The organic light-emitting display apparatus of claim 5, wherein portions of the first power supply line outside a portion of the first power supply line connected to the first pad and portions of the second power supply line outside a portion of the second power supply line connected to the second pad are encapsulated by an insulating material.

7. The organic light-emitting display apparatus of claim 1, wherein the first pad and the second pad are formed outside the encapsulation member of the substrate.

8. The organic light-emitting display apparatus of claim 1, wherein the first electrode is selectably connected to an anode and the second electrode is a cathode.

9. The organic light-emitting display apparatus of claim 1, wherein each of the first power supply line, the second power supply line, the first pad, and the second pad is formed of a metal material.

10. The organic light-emitting display apparatus of claim 9, wherein the metal material comprises any one selected from copper and silver.

11. The organic light-emitting display apparatus of claim 1, further comprising:
    a plurality of first pads each including a covered portion which is overlapped by the encapsulation member; and
    a plurality of second pads each including a covered portion which is overlapped by encapsulation member.

12. The organic light-emitting display apparatus of claim 11, wherein the first and second pads extend from the perimeter of the encapsulation layer on at least first and second sides of the encapsulation layer

\* \* \* \* \*